US 12,402,375 B2

(12) United States Patent
Wernersson et al.

(10) Patent No.: US 12,402,375 B2
(45) Date of Patent: Aug. 26, 2025

(54) ASYMMETRIC VERTICAL NANOWIRE MOSFET HAVING ASYMMETRIC NANOWIRE GEOMETRY NEAR METAL GATE AND METHOD OF FABRICATING THEREOF

(71) Applicant: C2Amps AB, Limhamn (SE)

(72) Inventors: Lars-Erik Wernersson, Lund (SE); Olli-Pekka Kilpi, Lund (SE)

(73) Assignee: C2Amps AB, Limhamn (SE)

( * ) Notice: Subject to any disclaimer, the term of this patent is extended or adjusted under 35 U.S.C. 154(b) by 641 days.

(21) Appl. No.: 17/760,800

(22) PCT Filed: Sep. 11, 2020

(86) PCT No.: PCT/EP2020/075437
§ 371 (c)(1),
(2) Date: Mar. 16, 2022

(87) PCT Pub. No.: WO2021/052878
PCT Pub. Date: Mar. 25, 2021

(65) Prior Publication Data
US 2022/0302256 A1    Sep. 22, 2022

(30) Foreign Application Priority Data
Sep. 16, 2019    (SE) .................................. 1951042-9

(51) Int. Cl.
H10D 62/10    (2025.01)
H10D 30/01    (2025.01)
(Continued)

(52) U.S. Cl.
CPC ......... H10D 62/121 (2025.01); H10D 30/031 (2025.01); H10D 30/6713 (2025.01);
(Continued)

(58) Field of Classification Search
CPC ..... H01L 21/823412; H01L 21/823418; H01L 29/66742; H01L 29/78618; H01L 29/78696; H01L 21/823487
(Continued)

(56) References Cited

U.S. PATENT DOCUMENTS 6,686,245 B1    2/2004  Mathew et al.
2006/0273389 A1  12/2006  Cohen et al.
(Continued)

FOREIGN PATENT DOCUMENTS

EP    2667416 A1    11/2013
WO    2008034850 A2    3/2008
(Continued)

OTHER PUBLICATIONS

Martin Berg, "Self-Aligned, Gate-Last Process for Vertical InAs Nanowire MOSFETs on Si", 2015 IEEE International Electron Devices Meeting (IEDM), IEEE, Dec. 7, 2015, pp. 803-806.
(Continued)

Primary Examiner — Fernando L Toledo
Assistant Examiner — Laura M Dykes
(74) Attorney, Agent, or Firm — Shih IP Law Group, PLLC.

(57) ABSTRACT

There is provided a method for fabricating an asymmetric vertical nanowire MOSFET on a semiconductor substrate comprising at least one vertical nanowire, comprising a core portion and a shell portion circumscribing the core portion. The method comprises depositing a protection layer on the semiconductor substrate, forming a top contact around a remaining portion of the vertical nanowire not covered by the protection layer, removing the protection layer, depositing a spacer layer on the semiconductor substrate, removing a shell portion of the intermediate portion of the bottom portion of the vertical nanowire, trimming a shell portion of
(Continued)

the upper portion of the bottom portion of the vertical nanowire, depositing a metal gate on the spacer layer, and forming a lower and an upper source drain portions.

8 Claims, 4 Drawing Sheets

(51) Int. Cl.
　　　*H10D 30/67*　　　(2025.01)
　　　*H10D 84/01*　　　(2025.01)
　　　*H10D 84/03*　　　(2025.01)
(52) U.S. Cl.
　　　CPC ..... *H10D 30/6755* (2025.01); *H10D 30/6757* (2025.01); *H10D 84/0128* (2025.01); *H10D 84/013* (2025.01); *H10D 84/038* (2025.01)
(58) Field of Classification Search
　　　USPC ........................................................ 257/288
　　　See application file for complete search history.

(56) References Cited

U.S. PATENT DOCUMENTS

| 2008/0169503 | A1* | 7/2008 | Appenzeller ....... H01L 29/0673 257/E21.04 |
| 2013/0313525 | A1 | 11/2013 | Rosaz et al. |
| 2014/0225184 | A1 | 8/2014 | Colinge et al. |
| 2015/0069330 | A1 | 3/2015 | Baek et al. |
| 2016/0064541 | A1 | 3/2016 | Diaz |

FOREIGN PATENT DOCUMENTS

| WO | 2016207127 A1 | 12/2016 | |
| WO | WO-2018206582 A1 * | 11/2018 | ............. B82Y 10/00 |

OTHER PUBLICATIONS

Jun-Sik Yoon, "Vertical gate-all-around junctionless nanowire transistors with asymmetric diameters and underlap lengths", Applied Physics Letters 105, 102105 (2014), 5 pages.
Olli-Pekka Kilpi, "Electrical Properties of Vertical InAs/InGaAs Heterostructure MOSFETs", vol. 7, 2019, Journal of the Electron Devices Society, pp. 70-75.
Olli-Pekka Kilpi, "Sub-100-nm Gate-Length Scaling of Vertical InAs/InGaAs Nanowire MOSFETs on Si", 1Department of Electrical and Information Technology, 978-1-5386-3559-9/17/$31.00 © 2017 IEEE, IEDM17, pp. 417-420.
Search Report dated Mar. 31, 2020.
T. Vasen, "Vertical Gate-All-Around Nanowire GaSb—InAs Core-Shell n-Type Tunnel FETs", Scientific Reports, Published Jan. 17, 2019, pp. 1-9.
Xin Zhao, "Source/Drain Asymmetry in InGaAs Vertical Nanowire MOSFETs", IEEE Transactions On Electron Devices, vol. 64, No. 5, May 2017, pp. 2161-2165.
International Search Report from International Application No. PCT/EP2020/075437 mailed Nov. 24, 2020.

* cited by examiner

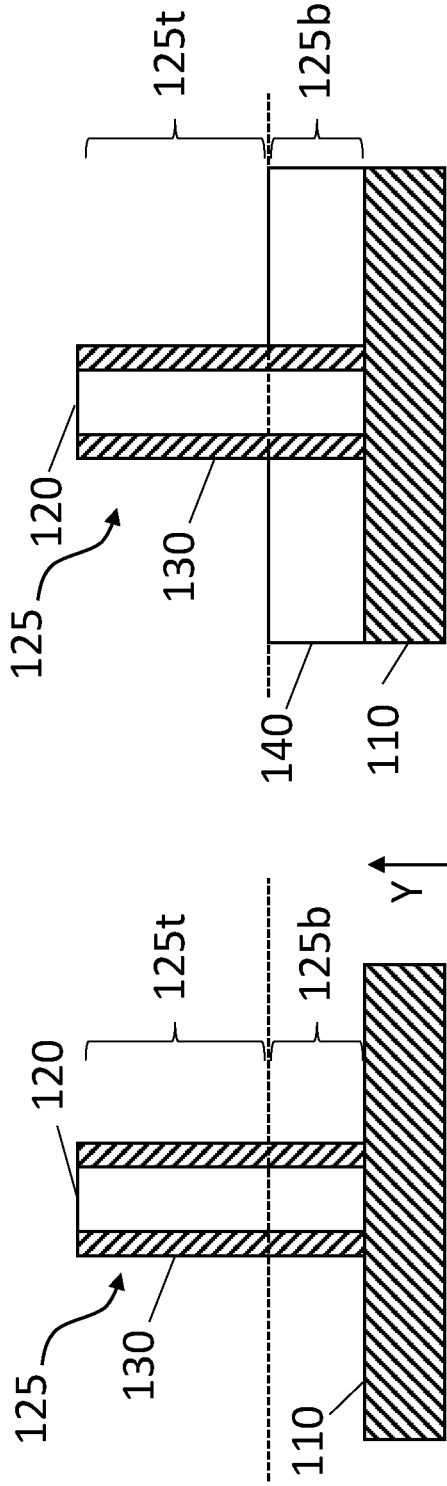
Fig. 1
Fig. 2
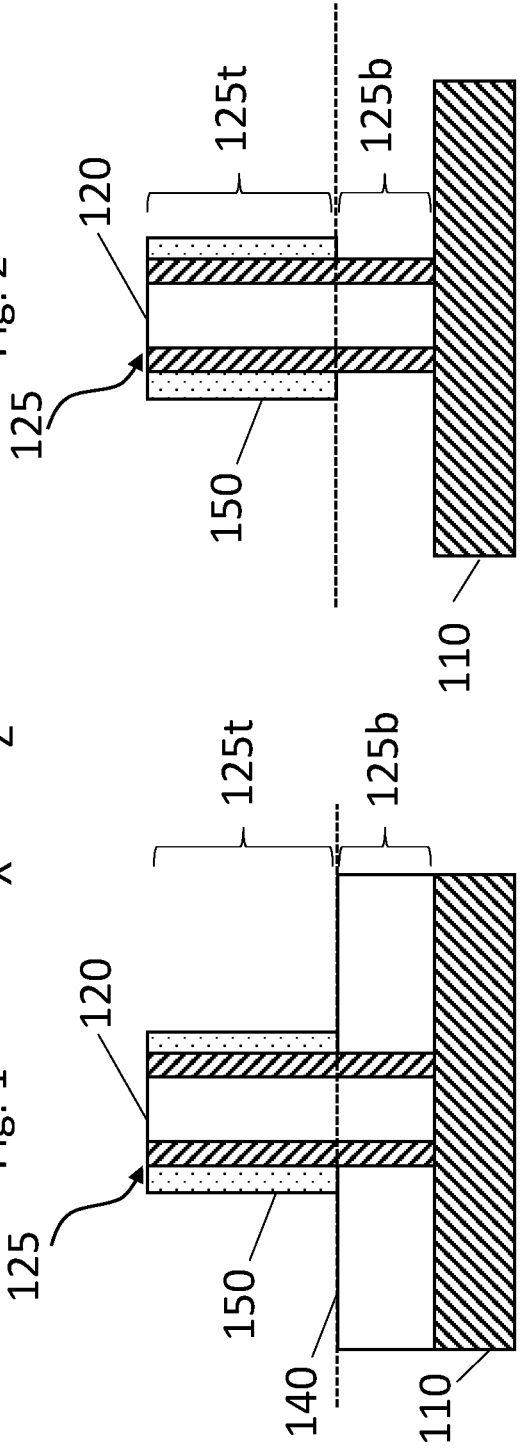
Fig. 3
Fig. 4

US 12,402,375 B2

ASYMMETRIC VERTICAL NANOWIRE MOSFET HAVING ASYMMETRIC NANOWIRE GEOMETRY NEAR METAL GATE AND METHOD OF FABRICATING THEREOF

CROSS-REFERENCE TO RELATED APPLICATIONS

This Application is the National Stage filing under 35 U.S.C. § 371 of PCT Application Ser. No. PCT/EP2020/075437 filed on Sep. 11, 2020, which claims the benefit of Swedish Patent Application No. 1951042-9 filed on Sep. 16, 2019. The disclosures of both applications are hereby incorporated herein by reference in their entireties.

TECHNICAL FIELD

The present inventive concept relates to a method for fabricating an asymmetric vertical nanowire metal oxide semiconductor field effect transistor (MOSFET) on a semiconductor substrate and an asymmetric vertical nanowire MOSFET.

BACKGROUND

Over the past years, vertical nanowire MOSFET devices have been developed allowing gate-all-around geometry. In particular, MOSFETs formed of III-V materials integrated on Si substrates may offer a possibility to decrease the supply voltage and hence to decrease a power consumption. However, vertical nanowire MOSFETs have shown rather low performance, compared to the state-of-art lateral MOSFETs. The lower performance of the vertical nanowire MOSFETs may be related to their longer gate length, higher access resistances and higher capacitances, compared to the lateral MOSFETs.

SUMMARY

An object of the present inventive concept is to, at least partly, overcome one or more of the above-identified limitations of the prior art.

According to an aspect of the present inventive concept there is provided a method for fabricating an asymmetric vertical nanowire MOSFET on a semiconductor substrate comprising at least one vertical nanowire, wherein the at least one vertical nanowire comprises a core portion and a shell portion circumscribing the core portion along a height of the nanowire, the method comprising: depositing a protection layer on the semiconductor substrate and around a bottom portion of the vertical nanowire, forming a top contact around a remaining portion of the vertical nanowire not covered by the protection layer, removing, by etching, the protection layer, depositing a spacer layer on the semiconductor substrate and around a lower portion of the bottom portion of the vertical nanowire, wherein a thickness of the spacer layer is smaller than the thickness of the protection layer and wherein a remaining portion of the bottom portion of the vertical nanowire, not covered by the spacer layer, comprises an intermediate portion and an upper portion, removing a shell portion of the intermediate portion of the bottom portion of the vertical nanowire, thereby exposing a core portion of the vertical nanowire at the intermediate portion of the bottom portion of the vertical nanowire, trimming a shell portion of the upper portion of the bottom portion of the vertical nanowire, thereby reducing a thickness of the shell portion of the upper portion of the bottom portion of the vertical nanowire or removing the sell portion of the upper portion of the bottom portion of the vertical nanowire, depositing a metal gate on the spacer layer and around the intermediate portion of the bottom portion of the nanowire, and forming a lower and an upper source drain portions.

The at least one vertical nanowire comprising a core portion and a shell portion allows e.g. a combination of two different materials. The step of depositing a protection layer on the semiconductor substrate and around a bottom portion of the vertical nanowire allows for protecting the bottom portion of the vertical nanowire during the step of forming the top contact. Thereby, the top contact is formed on the remaining portion of the vertical nanowire i.e. a top portion of the vertical nanowire not covered by the protection layer. In addition, a thickness of the protection layer may e.g. define a spacing between the top contact and the lower source drain portion. The step of removing, by etching, the protection layer allows access to the bottom portion of the vertical nanowire while the top portion of the nanowire is covered by the top contact. The step of depositing the spacer layer on the semiconductor substrate and around a lower portion of the bottom portion of the vertical nanowire allows defining the spacing between the gate and the lower source drain portion. For instance, a thickness of the spacer layer may affect the spacing between the gate and the lower source drain portion.

The steps of removing the shell portion of the intermediate portion of the bottom portion of the vertical nanowire and trimming the shell portion of the upper portion of the bottom portion of the vertical nanowire allow forming an asymmetric portion of the vertical nanowire arranged in close proximity of the metal gate i.e. the lower portion of the bottom portion of the vertical nanowire and the upper portion of bottom portion of the vertical nanowire become asymmetric. For instance, a thickness of the upper portion of the bottom portion of the vertical nanowire becomes smaller than a thickness of the lower portion of bottom portion of the vertical nanowire. The asymmetric vertical nanowire MOSFET in turn allows engineering a gate-source capacitance ($C_{gs}$) and a gate-drain capacitances ($C_{gd}$) such that asymmetric $C_{gs}$ and Co may be achieved. At the same time, the presence of the shell on in the direct vicinity of the metal gate, at least on one side of the metal gate, provides a mean to decrease the access resistance that is crucial for digital and radio frequency (RF) applications. The asymmetric $C_{gs}$ and Co may in turn improve a power gain of an obtained asymmetric vertical nanowire MOSFET.

By a vertical nanowire MOSFET is hereby meant a MOSFET comprising a semiconductor structure comprising a lower and an upper source drain portion and a channel portion located intermediate and extending vertically between the lower and upper source drain portions, and further comprising a gate structure extending vertically along the channel portion. The gate structure may at least partially enclose the channel portion. In particular, the gate structure may wrap-around the channel portion, in other words forming a gate-all-around (GAA) structure. The lower and upper source drain portions and the channel portion may intersect a common vertical plane. The channel portion is adapted to (in use of the device) conduct a vertical flow of charge carriers between the source drains.

As used herein, the term "vertical" denotes a direction or orientation (e.g. of a surface, a dimension or other feature) parallel to a normal direction of the substrate (i.e. a main plane of extension or main/upper surface thereof). The term "horizontal" meanwhile denotes a direction or orientation parallel to the substrate (i.e. a main plane of extension or main surface thereof), or equivalently transverse to the vertical direction.

For instance, by a "vertical nanowire" is hereby meant that the nanowire height extends parallel to a normal of the semiconductor substrate.

By "on" is hereby meant above and in contact with. For instance, by "depositing a protection layer on the semiconductor substrate" is hereby meant that the protection layer is deposited above and in contact with the semiconductor substrate.

Meanwhile, terms such as "bottom", "top", "lower" and "intermediate", "upper" refer to relative positions as viewed along the vertical direction and does hence not imply an absolute orientation of the substrate or device. For instance, the terms "bottom portion" and "top portion" of the nanowire refer to relative positions viewed along the vertical direction i.e. the "bottom portion" is arranged closer to the semiconductor substrate than the "top portion". In addition, the terms "lower", "intermediate", and "upper" portions of the bottom portion of the vertical nanowire refer to relative positions viewed along the vertical direction i.e. the "lower portion" is arranged closer to the semiconductor substrate than the "intermediate portion" and the "upper portion" and the "intermediate portion" is arranged closer to the semiconductor substrate than the "upper portion". The terms "lower source drain portion" and "upper source drain portion" refer to relative positions of the source drain portions viewed along the vertical direction.

By "asymmetric vertical nanowire MOSFET" is hereby meant that the nanowire geometry is not symmetric in close proximity of the metal gate i.e. the lower portion and the upper portion of the bottom portion of the vertical nanowire are asymmetric.

The step of trimming the shell portion of the upper portion of the bottom portion of the vertical nanowire may comprise removing the shell portion of the upper portion of the bottom portion of the vertical nanowire, thereby exposing a core portion of the vertical nanowire at the upper portion of the bottom portion of the vertical nanowire. Thereby an asymmetric vertical nanowire MOSFET may be achieved i.e. the lower portion of the bottom portion of the vertical nanowire may have a shell portion while the upper portion of the bottom portion of the vertical nanowire may have no or a little shell portion.

The step of removing the shell portion of the intermediate portion of the bottom portion of the vertical nanowire and the step of trimming the shell portion of the upper portion of the bottom portion of the vertical nanowire may be performed by etching. Etching may facilitate removing the shell portion of the intermediate portion of the bottom portion of the vertical nanowire and trimming the shell portion of the upper portion of the bottom portion of the vertical nanowire. For instance, the etching may be performed such that a rate of etching may be controlled. This may in turn allow an improved control during the step of removing the shell portion of the intermediate portion of the bottom portion of the vertical nanowire and the step of trimming the shell portion of the upper portion of the bottom portion of the vertical nanowire.

The step of removing the shell portion of the intermediate portion of the bottom portion of the vertical nanowire and the step of trimming the shell portion of the upper portion of the bottom portion of the vertical nanowire may be performed simultaneously. Thereby, the fabrication of an asymmetric vertical nanowire MOSFET may be facilitated. For instance, the number of processing steps to fabricate an asymmetric vertical nanowire MOSFET may be reduced. By "simultaneously" is hereby meant that the step of removing the shell portion of the intermediate portion of the bottom portion of the vertical nanowire and the step of trimming the shell portion of the upper portion of the bottom portion of the vertical nanowire are done in a same process and at the same time.

The method may further comprise masking the upper portion of the bottom portion of the vertical nanowire, prior to the step of removing the shell portion of the intermediate portion of the bottom portion of the vertical nanowire. Thereby, the upper portion of the bottom portion of the vertical nanowire may be protected during the step of removing the shell portion of the intermediate portion of the bottom portion of the vertical nanowire. This may in turn provide an improved control on the fabrication of the asymmetric vertical nanowire MOSFET.

The step of depositing the metal gate on the spacer layer and around the intermediate portion of the bottom portion of the vertical nanowire may be performed prior to the step of trimming the shell portion of the upper portion of the bottom portion of the vertical nanowire. Thereby the metal gate may protect the intermediate portion of the bottom portion of the vertical nanowire during the step of trimming the shell portion of the upper portion of the bottom portion of the vertical nanowire. In other words, the metal gate may mask the intermediate portion of the bottom portion of the vertical nanowire during the step of trimming the shell portion of the upper portion of the bottom portion of the vertical nanowire.

The method may further comprise unmasking the upper portion of the bottom portion of the vertical nanowire, prior to the step of trimming the shell portion of the upper portion of the bottom portion of the vertical nanowire. The unmasking may thereby allow accessing the upper portion of the bottom portion of the vertical nanowire prior to the step of trimming the shell portion of the upper portion of the bottom portion of the vertical nanowire.

The core portion of the vertical nanowire may be formed of InAs, InGaAs or a combination thereof. The core portion of the vertical nanowire may be formed of a binary material, a ternary material or a combination thereof. The binary and the ternary materials may be formed of any of III-V semiconductor materials. The core portion of the vertical nanowire may be doped with an n-type or a p-type dopant.

The shell portion of the vertical nanowire may be formed of InGaAs with an n-type dopant dose of at least $1.10^{16}$ atoms/cm$^3$. The shell portion of the vertical nanowire may be formed of a binary material, a ternary material or a combination thereof. The binary and the ternary materials may be formed of any of III-V semiconductor materials. The shell portion of the vertical nanowire may be doped with an n-type or a p-type dopant. A dose of the dopant may be in a range of $1.10^{16}$ to $1.10^{20}$ atoms/cm$^3$.

According to another aspect of the present inventive concept there is provided an asymmetric vertical nanowire MOSFET comprising: at least one vertical nanowire arranged on a semiconductor substrate, wherein the at least one vertical nanowire comprises a core portion and a shell portion circumscribing the core portion along a height of the vertical nanowire, a first spacer layer arranged on the semiconductor substrate and around a lower portion of a bottom portion of the vertical nanowire, a metal gate arranged on the first spacer layer and around an intermediate portion of the bottom portion of the vertical nanowire, wherein the intermediate portion of the bottom portion of the vertical nanowire comprises a through-going recess in the shell portion, the recess circumscribing the core portion, a second spacer layer arranged on the metal gate and at least around an upper portion of the bottom portion of the vertical nanowire, wherein the shell portion at the upper portion of the bottom portion of the vertical nanowire has a reduced thickness compared to the lower portion of the bottom portion of the vertical nanowire, a top contact arranged around a top portion of the vertical nanowire, wherein the shell portion of the top portion of the vertical nanowire has a corresponding thickness compared to the lower portion of the bottom portion of the vertical nanowire, and a lower and an upper source drain portions.

This aspect may generally present the same or corresponding advantages as the former aspect.

By "through-going recess" in the shell portion of the intermediate portion of the bottom portion of the vertical nanowire is hereby meant that there is no shell portion or a little shell portion at least at a portion of the intermediate portion of the bottom portion of the vertical nanowire. In other words, the at least a portion of the intermediate portion of the bottom portion of the vertical nanowire is void of any shell portion.

By "top contact" is hereby meant a contact portion arranged at the top portion of the vertical nanowire. The top contact may be a portion of the upper source drain portion. The top contact may be connected to the upper source drain portion.

The asymmetric vertical nanowire MOSFET may comprise a first vertical nanowire having a first diameter and a second vertical nanowire having a second diameter different from the first vertical nanowire. Thereby the asymmetric vertical nanowire MOSFET may operate at different threshold voltages.

The first vertical nanowire may have a first core portion and a first shell portion, and the second vertical nanowire may have a second core portion and a second shell portion. The first and the second vertical nanowires may be formed such that a first core portion may have a same dimeter as the second core portion and the first shell portion may have a different dimeter than the second shell portion. The first and the second vertical nanowires may be formed such that a first core portion may have a different dimeter than the second core portion and the first shell portion may have a same dimeter as the second shell portion. The first and the second vertical nanowires may be formed such that a first core portion may have a different dimeter than the second core portion and the first shell portion may have a different dimeter than the second shell portion.

The asymmetric vertical nanowire MOSFET may further comprise a gate oxide layer arranged in between the core portion of the intermediate portion of the bottom portion of the vertical nanowire and the metal gate. The gate oxide may facilitate modulation of a conductance of the asymmetric vertical nanowire MOSFET channel.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

FIGS. 1-10 schematically illustrate various steps of a method for fabricating an asymmetric vertical nanowire MOSFET on a semiconductor substrate.

DETAILED DESCRIPTION

Figure 5:
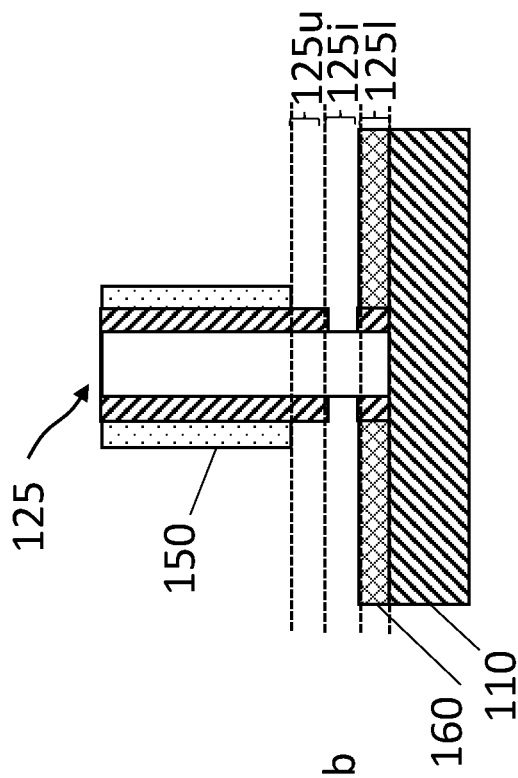

Various methods for fabricating an asymmetric vertical nanowire MOSFET on a semiconductor substrate will now be disclosed in connection with FIGS. 1-10.

FIG. 1 shows a cross-sectional view of semiconductor substrate 110 comprising at least one vertical nanowire 125. In FIG. 1, the axis Y denotes a vertical direction corresponding to a normal direction with respect to an upper surface of the semiconductor substrate 110. The axis X denotes a first horizontal direction along the semiconductor substrate 100 and the axis Z denotes a second horizontal direction along the semiconductor substrate 100, perpendicular to the first direction X. It should be noted that in the drawings the relative dimensions of the shown elements, such as the height, width or thickness of elements, is merely schematic and may, for the purpose of illustrational clarity, differ from a physical structure.

The semiconductor substrate 110 may be any conventional substrate 110, such as a substrate suitable for MOSFET processing. The substrate 110 may for instance be a semiconductor substrate such as a Si substrate, a Ge substrate or a silicon-germanium (SiGe) substrate. Other examples include a silicon-on-insulator (SOI) substrate, a GeOI substrate or a SiGeOI substrate. The substrate may comprise a stack of layers such as an InAs layer formed on a Si substrate. The InAs layer may be epitaxially grown on the Si substrate. The InAs layer may be epitaxially grown in a manner which per se is known in the art. The InAs layer may be formed using any suitable conventional technique, such as chemical vapor deposition (CVD), metalorganic CVD (MOCVD), molecular beam epitaxy (MBE) or vapor phase epitaxy (VPE). A typical thickness of the InAs layer may be in a range of 100 to 500 nm.

In FIG. 1 and the following figures, one vertical nanowire 125 is shown. However, it should be noted that the semiconductor substrate 110 may comprise any number of further vertical nanowires 125 outside the illustrated region.

The vertical nanowire 125 shown in FIG. 1 extends in parallel to the Y direction. By way of example, a typical height of the vertical nanowire 125 may be in a range of 300 to 600 nm. Shorter heights in the range of 50 to 300 may also be considered. A diameter of the vertical nanowire 125 i.e. along the X axis or the Z axis may be in a range from 15 to 100 nm. Diameters of 5 to 15 nm may also be considered. The vertical nanowire 125 may be formed in a manner which per se is known in the art, e.g. by etching an epitaxial semiconductor layer or layer stack formed on the semiconductor substrate 110. In the case of the InAs layer formed on the Si substrate, the vertical nanowire 125 may be formed by etching the InAs layer formed on the Si substrate. The vertical nanowire 125 may be epitaxially grown on the semiconductor substrate 110 in a manner which per se is known in the art. For instance, the vertical nanowire 125 may be grown using catalyst nanoparticles such as Au nanoparticles. The vertical nanowire 125 may be formed using any suitable conventional technique, such as CVD, MOCVD, MBE or VPE.

FIG. 1 shows that the vertical nanowire 125 comprises a core portion 120 and a shell portion 130 circumscribing the core portion 120 along a height of the vertical nanowire. The core portion 120 of the vertical nanowire 125 may be formed of InAs, InGaAs, or a combination thereof. The core portion 120 of the vertical nanowire 125 may comprise a stack of layers along the vertical direction i.e. along the height of the vertical nanowire 125. In other words, the core portion 120 of the vertical nanowire 125 may comprise an axial heterostructure. The core portion 120 of the vertical nanowire 125 may comprise a stack of layers perpendicular to the vertical direction i.e. along the width of the vertical nanowire 125. In other words, the core portion 120 of the vertical nanowire 125 may comprise a radial heterostructure. Any layer of the stack of layers may be formed of a binary material or a ternary material formed of III-V semiconductor materials. The core portion 120 of the vertical nanowire 125 may be doped with an n-type or p-type dopant. A diameter of the core portion 120 of the vertical nanowire 125 i.e. along the X axis or the Z axis may be in a range from 5 to 80 nm.

The shell portion 130 of the vertical nanowire 125 may be formed of InGaAs. The shell portion 130 of the vertical nanowire 125 may comprise a stack of layers. Any layer of the stack of layers may be formed of a binary material or a ternary material formed of III-V semiconductor materials. The shell portion 130 of the vertical nanowire 125 may be doped with an n-type or p-type dopant. In the case of n-type dopant, the n-type dopant dose of the shell portion 130 of the vertical nanowire 125 may be in a range of $1.10^{16}$ to $1.10^{20}$ atoms/cm$^3$. The n-type dopant dose of the shell portion 130 of the vertical nanowire 125 may at least be $1.10^{16}$ atoms/cm$^3$. A diameter of the shell portion 130 of the vertical nanowire 125 i.e. along the X axis or the Z axis may be in a range from 3 to 20 nm.

The core portion 120 and the shell portion 130 of the vertical nanowire 125 may be formed in a manner which per se is known in the art. For instance, in the case of epitaxial growth of the vertical nanowire 125, the growth of the core portion 120 and the shell portion 130 of the vertical nanowire 125 may be performed by selecting appropriate precursors controlling epitaxial growth parameters e.g. flows and temperature.

In addition, the semiconductor substrate 110 may comprise a first vertical nanowire 125 having a first diameter and a second vertical nanowire 125 having a second diameter different from the first vertical nanowire. In the case of epitaxial growth of the vertical nanowires 125, the first and the second vertical nanowire may e.g. be formed by using catalyst nanoparticles having different diameters.

Now referring to FIG. 2, the method proceeds by depositing a protection layer 140 on the semiconductor substrate and around a bottom portion 125b of the vertical nanowire 125. The protection layer 140 may be formed of one or several organic or inorganic layers, such as Hydrogen silsesquioxane (HSQ), SiNx, SiO2, BCB, and photoresists. The protection layer 140 may be deposited in a manner which per se is known in the art such as spin coating. A typical thickness of the protection layer 140 may be in a range of 10 to 100 nm. Thereby a typical height of the bottom portion 125b of the vertical nanowire 125 may be in a range of 10 to 100 nm.

Now referring to FIG. 3, the method proceeds by forming a top contact 150 around a remaining portion 120t of the vertical nanowire 125 not covered by the protection layer 140. FIG. 3 shows that the top contact 150 is formed on the top portion 125t of the vertical nanowire 125 not covered by the protection layer 140. The top contact 150 may be formed of any of metals such as W, TiN, and Ni. The top contact 150 may comprise a layer or a stack of layers. The top contact 150 may be formed in a manner which per se is known in the art such as sputtering and atomic layer deposition (ALD). A typical thickness of the top contact 150 along the X axis or the Z axis may be in a range of 3 to 50 nm. For instance, the top contact 150 may be formed by sputtering of 20 nm W, ALD of 5 nm TiN or 5 nm of Ni.

Now referring to FIG. 4, the method proceeds by removing the protection layer 140. The step of removing the protection layer 140 may be done by wet etching of the protection layer 140. The wet etching of the protection layer 140 may be performed using hydrofluoric acid (HF). The step of removing the protection layer 140 from the bottom portion 125b of vertical nanowire 125 may proceed until the bottom portion 125b of vertical nanowire 125 is exposed. FIG. 4 shows the vertical nanowire 125 subsequent to the step of removing the protection layer 140 from the bottom portion 125b of vertical nanowire 125. FIG. 4 shows that the bottom portion 125b of vertical nanowire 125 is exposed.

Now referring to FIG. 5, the method proceeds by depositing a spacer layer 160 on the semiconductor substrate 110. FIG. 5 shows that the spacer layer 160 is deposited around a lower portion 120l of the bottom portion 125b of the vertical nanowire 125. FIG. 5 further shows that a thickness of the spacer layer 160 is smaller than the thickness of the protection layer 140. FIG. 5 further shows that a remaining portion of the bottom portion 125b of the vertical nanowire 125, not covered by the spacer layer 160, comprises an intermediate portion 125i and an upper portion 125u. The spacer layer 160 may be formed of an inorganic material such as SiO$_2$ or an organic material such as BCB. The spacer layer 160 may be deposited in a manner which per se is known in the art such as plasma enhanced chemical vapor deposition (PECVD), CVD, spin-coating or ALD. A typical thickness of the spacer layer 160 may be in a range of 5 to 150 nm.

Figure 6:
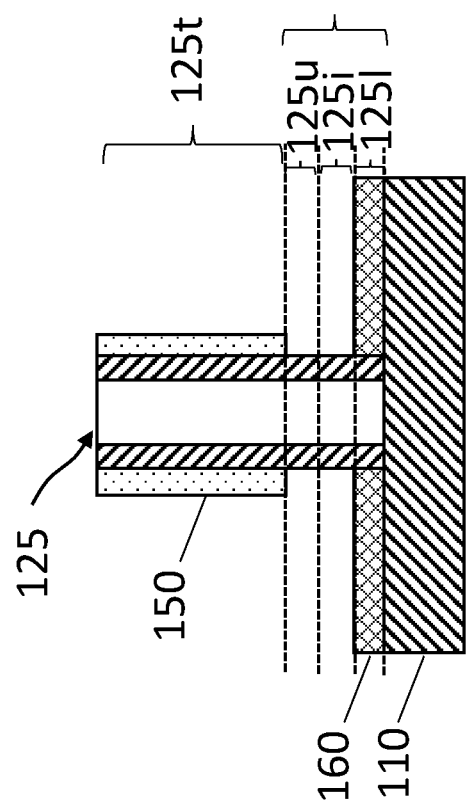

Now referring to FIG. 6, the method proceeds by removing a shell portion of the intermediate portion 125i of the bottom portion 125b of the vertical nanowire 125. FIG. 6 shows that a core portion of the intermediate portion 125i of the bottom portion 125b of the vertical nanowire 125 has been exposed subsequent to the step of removing the shell portion of the intermediate portion 125i of the bottom portion 125b of the vertical nanowire 125. The step of removing the shell portion of the intermediate portion 125i of the bottom portion 125b of the vertical nanowire 125 may be performed by etching. The etching may be performed in a manner which per se is known in the art such as using cyclic etching using e.g. hydrochloric acid (HCl) and oxygen treatment. The etching may be performed in-situ or by transferring the samples between different equipment. The chemicals may further be selected to either be selective or non-selective with respect to the core and the shell materials.

The upper portion 125u of the bottom portion 125b of the vertical nanowire 125 may be masked, prior to the step of removing the shell portion of the intermediate portion 125i of the bottom portion 125b of the vertical nanowire 125. The masking of the upper portion 125u of the bottom portion 125b of the vertical nanowire 125 may be performed in a manner which per se is known in the art.

Figure 7A:
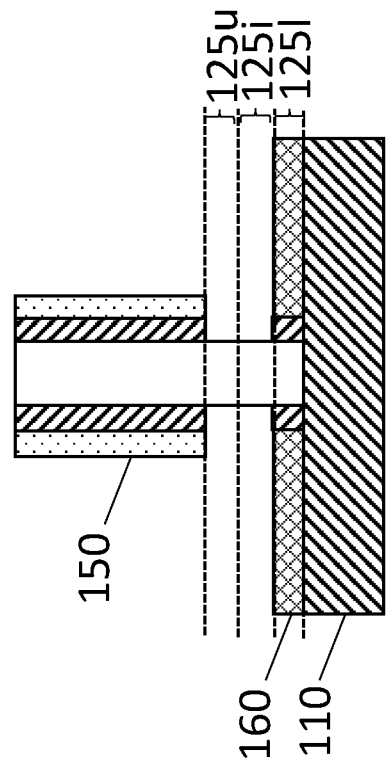

Now referring to FIG. 7a, the method proceeds by trimming a shell portion of the upper portion 125u of the bottom portion 125b of the vertical nanowire 125. FIG. 7a shows that a thickness of the shell portion at the upper portion 125u of the bottom portion 125b of the vertical nanowire 125 has been reduced. FIG. 7a shows that the shell thickness at the upper portion 125u of the bottom portion 125b of the vertical nanowire 125 is smaller than the shell thickness at the lower portion 120l of the bottom portion 125b of the vertical nanowire 125 i.e. the shell thicknesses at the upper portion 125u and the lower portion 120l of the bottom portion 125b of the vertical nanowire 125 are asymmetric. In the case that the upper portion 125u of the bottom portion 125b of the vertical nanowire 125 has been masked, prior to the step of removing the shell portion of the intermediate portion 125*i* of the bottom portion 125*b* of the vertical nanowire 125, the method may further comprise unmasking the upper portion (125*u*) of the bottom portion (125*b*) of the vertical nanowire (125), prior to the step of trimming the shell portion of the upper portion (125*u*) of the bottom portion (125*b*) of the vertical nanowire (125).

The step of trimming the shell portion of the upper portion 125*u* of the bottom portion 125*b* of the vertical nanowire 125 may be performed by etching. The step of trimming may be performed in a manner similar to the step of removing the shell portion of the intermediate portion 125*i* of the bottom portion 125*b* of the vertical nanowire 125. The step of trimming may be controlled such that a desired thickness of the shell portion of the upper portion 125*u* of the bottom portion 125*b* of the vertical nanowire 125 may be removed. The step of trimming may e.g. be controlled by controlling an etching time. The thickness of the shell portion of the upper portion 125*u* of the bottom portion 125*b* of the vertical nanowire 125 may be reduced by a factor of 30-80%, subsequent to the step of trimming. The intermediate portion 125*i* of the bottom portion 125*b* of the vertical nanowire 125 may be masked, prior to the step of trimming the shell portion of the upper portion 125*u* of the bottom portion 125*b* of the vertical nanowire 125. The masking of the intermediate portion 125*i* of the bottom portion 125*b* of the vertical nanowire 125 may performed by repeating the above described process steps with a new mask that has a different thickness as compared to the mask used for masking the upper portion 125*u* of the bottom portion 125*b* of the vertical nanowire 125.

Figure 7B:
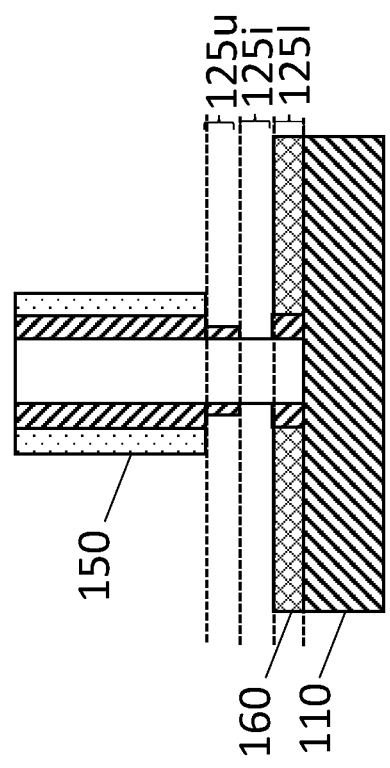

Now referring to FIG. 7*b*, the step of trimming the shell portion of the upper portion 125*u* of the bottom portion 125*b* of the vertical nanowire 125 may comprise removing the shell portion of the upper portion 125*u* of the bottom portion 125*b* of the vertical nanowire 125. FIG. 7*b* shows that a core portion of the vertical nanowire 125 at the upper portion 125*u* of the bottom portion 125*b* of the vertical nanowire 125 has been exposed. In other words, the upper portion 125*u* and the lower portion 125*l* of the bottom portion 125*b* of the vertical nanowire 125 have become asymmetric.

Still referring to FIG. 7*b*, the step of removing the shell portion of the intermediate portion 125*i* of the bottom portion 125*b* of the vertical nanowire 125 and the step of removing the shell portion of the upper portion 125*u* of the bottom portion 125*b* of the vertical nanowire 125 may be performed by etching. The steps of removing the shell portion of the intermediate portion 125*i* of the bottom portion 125*b* of the vertical nanowire 125 and the step of trimming the shell portion of the upper portion 125*u* of the bottom portion 125*b* of the vertical nanowire 125 may be performed simultaneously. For instance, steps of removing the shell portion of the intermediate portion 125*i* of the bottom portion 125*b* of the vertical nanowire 125 and the step of trimming the shell portion of the upper portion 125*u* of the bottom portion 125*b* of the vertical nanowire 125 may be performed in a same etching process using the same etchant.

The method may comprise forming a gate oxide layer around the core portion of the intermediate portion 125*i* of the bottom portion 125*b* of the vertical nanowire 125. The gate oxide layer may be formed of at least a high-k dielectric material such as $HfO_x$. The gate oxide layer may be formed in a manner which per se is known in the art such as ALD. A typical thickness of the gate oxide layer may be in a range of 1 to 6 nm. An example of gate oxide layer may be $Al_2O_3/HfO_2$ with a typical thickness of 1 nm $Al_2O_3$.

Figure 8A:
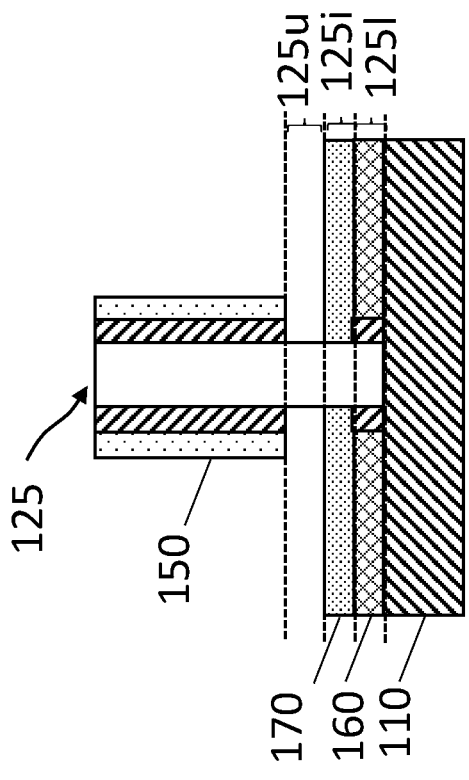
Figure 8B:
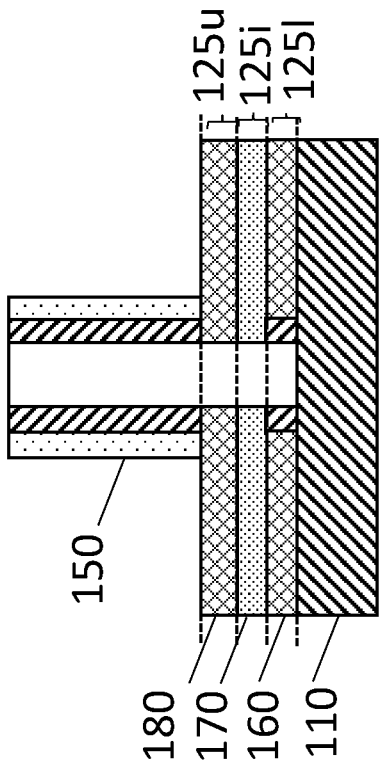

Now referring to FIGS. 8*a* and 8*b*, the method proceeds by depositing a metal gate 170 on the spacer layer 160 and around the intermediate portion 125*i* of the bottom portion 125*b* of the vertical nanowire 125 i.e. depositing the metal gate 170 on the spacer layer 160 and around the gate oxide layer if present. The metal gate 170 may be deposited in a manner which per se is known in the art such as sputtering and ALD. The metal gate 170 may be formed of at least a metal such as TiN and W. A typical thickness of the metal gate 170 may be in a range of 5 to 100 nm.

Referring to FIG. 8*a*, the step of depositing the metal gate 170 on the spacer layer 160 and around the intermediate portion 125*i* of the bottom portion 125*b* of the vertical nanowire 125 may be performed prior to the step of trimming the shell portion of the upper portion 125*u* of the bottom portion 125*b* of the vertical nanowire 125. In other words, the step of trimming the shell portion of the upper portion 125*u* of the bottom portion 125*b* of the vertical nanowire 125 may be performed subsequent to the step of depositing the gate oxide layer and the metal gate 170 on the spacer layer 160 and around the intermediate portion 125*i* of the bottom portion 125*b* of the vertical nanowire 125. In this way, the intermediate portion 125*i* of the bottom portion 125*b* of the vertical nanowire 125 may be protected by the metal gate 170 during the step of trimming the shell portion of the upper portion 125*u* of the bottom portion 125*b* of the vertical nanowire 125.

Figure 9A:
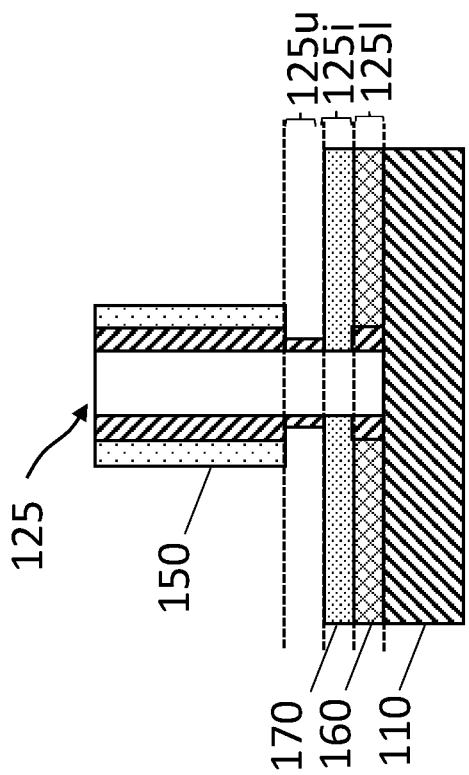
Figure 9B:
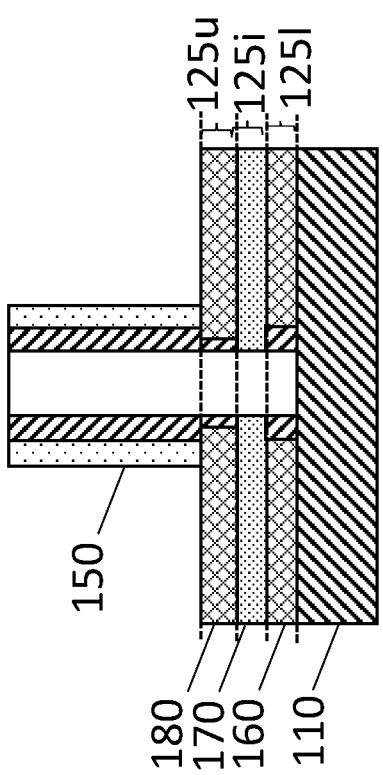

Now referring to FIGS. 9*a* and 9*b*, the method may proceed by depositing another spacer layer 180 e.g. a second spacer layer 180 on the metal gate 170 and around at least the upper portion 125*u* of the bottom portion 125*b* of the vertical nanowire 125. The second spacer layer 180 may be deposited in a similar manner as of the spacer layer 160 i.e. the first spacer layer 160. A thickness of the second spacer layer 180 may be in a range of 20 to 200 nm. The second spacer layer 180 may be deposited such that the thickness of the second spacer layer 180 may be similar to a height of the upper portion 125*u* of the bottom portion 125*b* of the vertical nanowire 125. The second spacer layer 180 may be deposited such that the thickness of the second spacer layer 180 may be larger than the height of the upper portion 125*u* of the bottom portion 125*b* of the vertical nanowire 125.

Figure 10B:
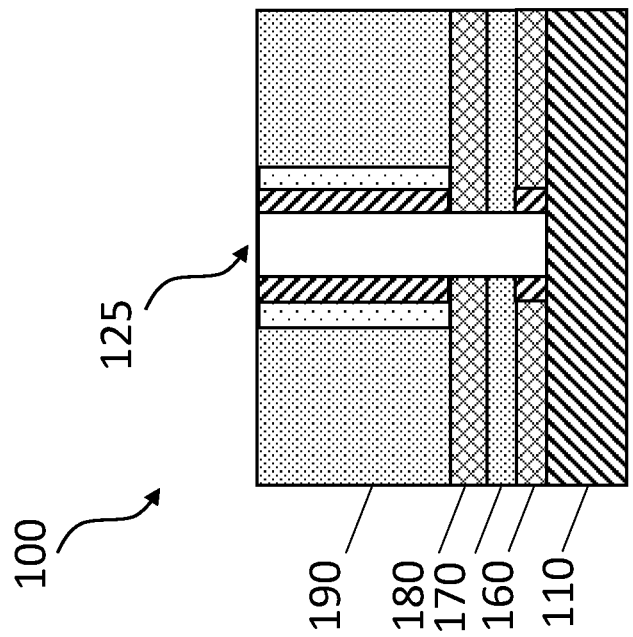
Figure 10A:
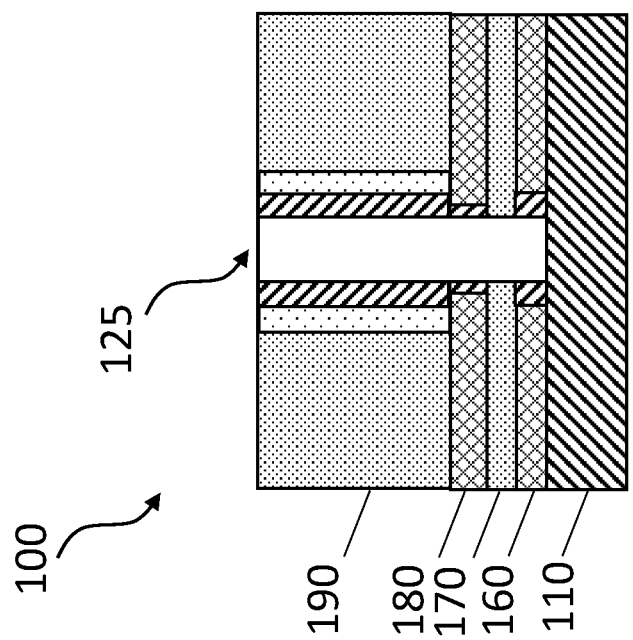

Now referring to FIGS. 10*a* and 10*b*, the method proceeds by forming a lower and an upper source drain portions 110 and 190. The lower and the upper source drain portions may respectively be comprised in a lower and an upper source drain contacts. FIGS. 10*a* and 10*b* show an example of an upper source drain portion 190 i.e. a metal upper source drain portion 190 has been deposited on the second spacer layer 180 and around the top portion 125*t* of the vertical nanowire 125. The upper source drain portion 190 may have a thickness similar to a height of the top portion 125*t* of the bottom portion 125*b* of the vertical nanowire 125. The upper source drain portion 190 may have a thickness different than the height of the top portion 125*t* of the bottom portion 125*b* of the vertical nanowire 125. The upper source drain portion 190 may be deposited in a manner which per se is known in the art such as sputtering.

In the case that the semiconductor substrate 110 comprises a highly doped portion e.g. a highly doped InAs layer formed on the Si substrate, that highly doped portion may be formed as the lower source drain portion. As shown in FIGS. 10*a* and 10*b*, the semiconductor substrate 110 acts as the lower source drain portion 110. The lower source drain portion may be formed in a manner which per se is known in the art. For instance, the lower source drain portion may be formed by pattering of the highly doped portion using e.g. electron beam lithography.

Still referring to FIGS. 10a and 10b, these figures schematically illustrate two examples of the asymmetric vertical nanowire MOSFETs 100. FIGS. 10a and 10b show two asymmetric vertical nanowire MOSFETs 100 comprising at least one vertical nanowire 125 arranged on a semiconductor substrate 110. FIGS. 10a and 10b further show that the at least one vertical nanowire 125 comprises a core portion 120 and a shell portion 130. FIGS. 10a and 10b show that the shell portion 130 circumscribes the core portion 120 along a height of the vertical nanowire 125. FIGS. 10a and 10b further show a first spacer layer 160 arranged on the semiconductor substrate 110 and around a lower portion 125l of a bottom portion 125b of the vertical nanowire 125. FIGS. 10a and 10b further show a metal gate 170 arranged on the first spacer layer 160 and around an intermediate portion 125i of the bottom portion 125b of the vertical nanowire 125. FIGS. 10a and 10b show that the intermediate portion 125i of the bottom portion 125b of the vertical nanowire 125 comprises a through-going recess in the shell portion such that the recess circumscribes the core portion 120.

FIGS. 10a and 10b show that a second spacer layer 180 is arranged on the metal gate 170 and at least around an upper portion 125u of the bottom portion 125b of the vertical nanowire 125. FIGS. 10a and 10b further show that the shell portion at the upper portion 125u of the bottom portion 125b of the vertical nanowire 125 has a reduced thickness compared to the lower portion 125l of the bottom portion 125b of the vertical nanowire 125. FIGS. 10a and 10b further show a top contact 150 arranged around a top portion 125t of the vertical nanowire 125. FIGS. 10a and 10b show that the shell portion of the top portion 125t of the vertical nanowire 125 has a corresponding thickness compared to the lower portion 125l of the bottom portion 125b of the vertical nanowire 125. FIGS. 10a and 10b further show a lower source drain portion 110 and an upper source drain portion 190. The asymmetric vertical nanowire MOSFETs 100 presented in FIGS. 10a and 10b demonstrate transistors with an asymmetric shell structure in the direct vicinity of the gate metal 170. The asymmetric shell structure provides, on one side of the metal gate, a low access resistance provided by the presence of the shell portion 130. The asymmetric shell structure provides, on the other side of the metal gate, a low capacitance provided by the separation of the shell portion 130 and the metal gate 170. Combined these two properties provide advantages in the design of the high-frequency transistors and including their gain properties.

In the above the inventive concept has mainly been described with reference to a limited number of examples. However, as is readily appreciated by a person skilled in the art, other examples than the ones disclosed above are equally possible within the scope of the inventive concept, as defined by the appended claims. The person skilled in the art realizes that the present invention by no means is limited to the preferred embodiments described above. On the contrary, many modifications and variations are possible within the scope of the appended claims.

For example, a portion of the core portion of the intermediate portion of the bottom portion of the vertical nanowire may be removed, subsequent to removing a shell portion of the intermediate portion of the bottom portion of the vertical nanowire. Another example, a portion of the core portion of the upper portion of the bottom portion of the vertical nanowire may be removed, subsequent to removing a shell portion of the upper portion of the bottom portion of the vertical nanowire. Additionally, variations to the disclosed embodiments can be understood and effected by the skilled person in practicing the claimed invention, from a study of the drawings, the disclosure, and the appended claims.

What is claimed is:

1. A method for fabricating an asymmetric vertical nanowire MOSFET on a semiconductor substrate comprising at least one vertical nanowire, wherein the at least one vertical nanowire comprises a core portion and a shell portion circumscribing the core portion along a height of the vertical nanowire, the method comprising:
    depositing a protection layer on the semiconductor substrate and around a bottom portion of the vertical nanowire,
    forming a top contact around a remaining portion of the vertical nanowire not covered by the protection layer,
    removing, by etching, the protection layer,
    depositing a spacer layer on the semiconductor substrate and around a lower portion of the bottom portion of the vertical nanowire, wherein a thickness of the spacer layer is smaller than the thickness of the protection layer and wherein a remaining portion of the bottom portion of the vertical nanowire, not covered by the spacer layer, comprises an intermediate portion and an upper portion,
    removing a shell portion of the intermediate portion of the bottom portion of the vertical nanowire, thereby exposing a core portion of the vertical nanowire at the intermediate portion of the bottom portion of the vertical nanowire,
    masking the upper portion of the bottom portion of the vertical nanowire, prior to the step of removing the shell portion of the intermediate portion of the bottom portion of the vertical nanowire,
    trimming a shell portion of the upper portion of the bottom portion of the vertical nanowire, thereby reducing a thickness of the shell portion of the upper portion of the bottom portion of the vertical nanowire or removing the shell portion of the upper portion of the bottom portion of the vertical nanowire,
    depositing a metal gate on the spacer layer and around the intermediate portion of the bottom portion of the vertical nanowire, and
    forming a lower and an upper source drain portions.

2. The method according to claim 1, wherein the step of trimming the shell portion of the upper portion of the bottom portion of the vertical nanowire comprises removing the shell portion of the upper portion of the bottom portion of the vertical nanowire, thereby exposing a core portion of the vertical nanowire at the upper portion of the bottom portion of the vertical nanowire.

3. The method according to claim 1, wherein the step of removing the shell portion of the intermediate portion of the bottom portion of the vertical nanowire and the step of trimming the shell portion of the upper portion of the bottom portion of the vertical nanowire are performed by etching.

4. The method according to claim 1, wherein the step of removing the shell portion of the intermediate portion of the bottom portion of the vertical nanowire and the step of trimming the shell portion of the upper portion of the bottom portion of the vertical nanowire are performed simultaneously.

5. The method according to claim 1, wherein the step of depositing the metal gate on the spacer layer and around the intermediate portion of the bottom portion of the vertical nanowire is performed prior to the step of trimming the shell portion of the upper portion of the bottom portion of the vertical nanowire.

6. The method according to claim 5, further comprising:
   unmasking the upper portion of the bottom portion of the vertical nanowire, prior to the step of trimming the shell portion of the upper portion of the bottom portion of the vertical nanowire.

7. The method according to claim 5, wherein the core portion of the vertical nanowire is formed of InAs, InGaAs, or a combination thereof.

8. The method according to claim 1, wherein the shell portion of the vertical nanowire is formed of InGaAs with an n-type dopant dose of at least $1.10^{16}$ atoms/cm$^3$.

* * * * *